(12) United States Patent
Smith et al.

(10) Patent No.: US 6,956,199 B2
(45) Date of Patent: *Oct. 18, 2005

(54) METHOD AND APPARATUS FOR DETERMINING A POSITION OF A MOVABLE BARRIER

(75) Inventors: Alan Dane Smith, Sahuarita, AZ (US); Christopher M. Valente, Lombard, IL (US); Martin Rathgeber, Chicago, IL (US); Mark D. Siegler, Aurora, IL (US); James J. Fitzgibbon, Batavia, IL (US)

(73) Assignee: The Chamberlain Group, Inc., Elmhurst, IL (US)

(*) Notice: Subject to any disclaimer, the term of this patent is extended or adjusted under 35 U.S.C. 154(b) by 66 days.

This patent is subject to a terminal disclaimer.

(21) Appl. No.: 10/666,453

(22) Filed: Sep. 17, 2003

(65) Prior Publication Data

US 2005/0035280 A1 Feb. 17, 2005

Related U.S. Application Data (63) Continuation of application No. 10/137,580, filed on May 2, 2002, which is a continuation of application No. 09/777,944, filed on Feb. 6, 2001, now Pat. No. 6,376,832, which is a continuation of application No. 09/251,307, filed on Feb. 17, 1999, now abandoned.

(51) Int. Cl.[7] .................................................. G01D 5/34
(52) U.S. Cl. ............................ 250/231.14; 250/231.18; 341/13
(58) Field of Search ....................... 250/231.13–231.15, 250/231.18, 221, 222.1; 341/13, 31; 356/614, 616, 617

(56) References Cited

U.S. PATENT DOCUMENTS

| | | | |
|---|---|---|---|
| 4,628,298 A | * 12/1986 | Hafle et al. .................... 341/1 |
| 6,376,832 B1 | * 4/2002 | Smith et al. ........... 250/231.14 |
| 2004/0169133 A1 | * 9/2004 | Smith et al. ........... 250/231.14 |

* cited by examiner

*Primary Examiner*—Stephone B. Allen
(74) *Attorney, Agent, or Firm*—Fitch, Even, Tabin & Flannery (57) ABSTRACT

A movable barrier operator includes an absolute position detector which provides a unique value for each position of the barrier along its path of travel. The absolute position detector employs multiple binary serial streams and one multiple clock stream. After the first five cycles of the clock stream, the binary streams can be decoded by a processor to produce an absolute position. Every clock edge produces a new absolute position along the path of travel.

14 Claims, 11 Drawing Sheets

METHOD AND APPARATUS FOR DETERMINING A POSITION OF A MOVABLE BARRIER

This is a continuation, of prior application number 10/137,580, filed May 2, 2002, which is a continuation application number 09/777,944, filed Feb. 6, 2001, now U.S. Pat. No. 6,376,832 which is a continuation of application number 09/251,307, filed Feb. 17, 1999, now abandoned hereby incorporated herein by reference in its entirety.

BACKGROUND OF THE INVENTION

1. Field of the Invention

The invention relates to operators for movable barriers, such as rolling shutters, retractable awnings, gates, garage doors, overhead doors and the like, and more particularly to operators which can determine the absolute position of the barrier at all times, including after a power outage and subsequent manual relocation of the barrier.

2. Description of Related Art

One of the problems which must be addressed in designing and engineering operators for movable barriers is the provision of barrier position detection. Most electronic positioning systems used in barrier operators keep track of the barrier's position by incrementing a position counter during one direction of travel and decrementing the position counter during the opposite direction of travel. This can cause errors if there are missed pulses or extraneous pulses during travel (such as from slippage of the barrier or motor).

Some barrier position detection systems employ a pass point. The pass point corresponds to a fixed location on the barrier, so that whenever the barrier moves past the pass point, the position detector is normalized or calibrated. By normalizing or zeroing out the position detector (or counter), the effects of missed pulses or slippage are eliminated. Some systems employ multiple pass points which provide further error removal capability. The pass point is a good solution in most situations, such as for garage door operators, which seldom move manually.

A more significant problem can occur in motorized awnings or rolling shutters. The rolling shutter assembly is frequently installed in a housing which is built into a wall. If power goes out on a rolling shutter system, the user will frequently move the rolling shutter manually to either open or close it. The power is off, but the gears of the positioning system move without power applied to assure manual override of an electric system for the purpose of power failures. Some users may also decide for convenience to move the shutter manually. When power returns, if the rolling shutter has been manually moved past all pass points, the operator, not encountering the pass point reference, may cause the rolling shutter to continue to move completely into the housing necessitating removal of the shutter from the housing. Removal of the rolling shutter from the housing frequently means removing a portion of an interior wall.

There is a need for a movable barrier operator with a position indicating system that provides the absolute position of the barrier, even after power outages or after the barrier has been moved manually. There is a need for a movable barrier operator which can unambiguously determine the position of the barrier after power is applied. There is a need for a movable barrier operator which can unambiguously determine the position of the barrier regardless of direction of travel.

SUMMARY OF THE INVENTION

A barrier operator position detector includes a first rotary member which is encoded to generate a first N bit subcode selected from N sequential bits of a M bit code word. The first N bit subcode has the property that every selected subcode of N sequential bits of the M bit code word has a unique value. N is greater than 1 and preferably 5. M is greater than N and preferably 32. A second rotary member is encoded to generate a second N bit subcode selected from N sequential bits of a M–1 bit code word, the second N bit subcode also has the property that every selected subcode of N sequential bits of the M–1 bit code word has a unique value (preferably M–1 is 31). A controller, responsive to the first subcode and the second subcode, generates a 2N bit multibit (or two N–bit subcodes) code. The 2N bit subcode is representative of a unique position output, which can be decoded into a unique position of the barrier along its travel.

A movable barrier operator according to the invention includes an absolute position detector which provides a unique value for each position of the barrier along its path of travel. The absolute position detector employs two binary serial streams and one clock stream. After the first five cycles of the clock stream, the binary serial streams can be decoded by a microprocessor or other processor to produce an absolute position indication. Every clock edge produces a new absolute position value along the path of travel.

The absolute position detector employs three wheels; two data wheels and a clock wheel driven by a pinon. Each wheel rotates near a wheel state detector which produces digital signals comprising bit streams. Preferably an infrared emitter-sensor pair is used as the wheel state detector. However, any electromechanical system which produces a digital signal comprising bit streams, such as Hall sensors, laser discs, and so on, may be used. For convenience, the absolute position detector of the invention will be described in detail with reference only to the infrared emitter-sensor embodiment.

In the preferred embodiment, two of the wheels are data wheels or gears and have teeth distributed around their outer portions. One wheel has 32 teeth, the other wheel has 31 teeth. Each tooth of each data wheel has a corresponding data bit formed in the wheel before the tooth. Each data bit represents a single binary data bit. A space formed below a tooth represents a digital low; a solid area formed below the tooth represents a digital high. The 32 teeth wheel has a 32 bit binary stream formed in it. The stream is uniquely defined so that any consecutive 5 bits in the stream are different from any other consecutive 5 bits in the stream, including the rollover stream. The 31 teeth wheel is similarly defined, except the 31 teeth wheel has the same bit binary stream as the 32 bit wheel, with one bit missing.

Since the 32 teeth wheel and the 31 teeth wheel have different numbers of teeth and are driven by the same pinion, they rotate at different speeds. The pinion is driven externally by a gearing system that is driven by the motor. The motor can rotate clockwise or counterclockwise, so the pinion can also turn in both directions. Since the motor is bi-directional, an attached load comprising a barrier such as a door, awning, shutter or gate can move in either of two opposite directions. Preferably direction of travel information is obtained by storing the commanded direction of travel (i.e., the user commands the door to open by pushing the open button or to close by pushing a close button).

The movable barrier is operated through linear linkage of the load to the motor such as a trolley, or through rotational linkage to the motor, where the load is wound around the entire operator unit, such as in a rolling shutters. Since the two data wheels rotate at different speeds (because of the different number of teeth), the two binary streams have different repeat rates. This means that a given 5 bit stream from the 32 teeth wheel will not combine with the corresponding 5 bit stream from the 31 teeth wheel until 31 more revolutions of the 32 teeth wheel, or vice versa. In other words, a total of 31×32=992 unique two word values are possible without a rollover or repeated position concern. 992 unique positions is large enough to provide absolute position along a part of a movable barrier in most situations. An extra data wheel may be added for more positions (i.e., 32×31× 30=29,760 positions). This mechanical linkage also means if the unit is moved manually, the 31 bit wheel and the 32 bit wheel will move, storing or representing for later reading by the controller, the position of the awning, door or shutter.

The third wheel is a clock wheel and is used to provide a clock signal for the position detecting system to enable proper sampling of the data wheel bit streams. The clock wheel includes 32 equally spaced openings. The clock wheel provides a digital low pulse signal when the center of a data bit on the 32 teeth wheel lines up with the center of a data bit on the 31 teeth wheel and when these centers are in line with the IR sensors. The clock signal is provided to the microprocessor which uses the clock signal as an interrupt to sample binary data from emitter-receiver pair associated with each data wheel. After the first 5 clock cycles, each data wheel has output a 5 digit binary stream, which when combined, gives 2 five digit binary numbers. This 5 digit binary number pair is decoded by the microprocessor which calculates an absolute position. Thereafter, every clock cycle triggers the sampling of a new binary digit from each wheel, the stored 5 binary number pair is updated, and a new absolute position of the barrier is determined.

The movable barrier operator according to the invention with absolute position detector (or encoder system) provides many advantages. It provides the absolute position of the barrier for every pulse edge of the clock signal from positioning gears turned by motor's gearing system. Shortly after power is applied to the motor, the clock wheel would have produced 5 pulses. After 5 pulses, the encoder system. determines the absolute position of the barrier. The encoder system can provide direction of travel after six pulses of the clock wheel. The encoder system discriminates false or unwanted pulses to prevent false positioning.

An absolute position is always provided shortly after power is applied (after 5 pulses and the first 5 digit binary pair is obtained), regardless of the stored value of the last position and regardless of where the barrier may have been moved manually. The absolute position detector also provides an opportunity for the system to do a validity check for every newly calculated position (i.e., by checking the absolute position between successive data streams, the direction of travel can be ascertained). It should also be noted that no presetting of the wheels prior to installation/ operation is required.

Additional advantages and features of the invention may be appreciated from a perusal of the specification, including claims in light of the accompanying drawing.

DETAILED DESCRIPTION OF THE PREFERRED EMBODIMENTS

Figure 1:
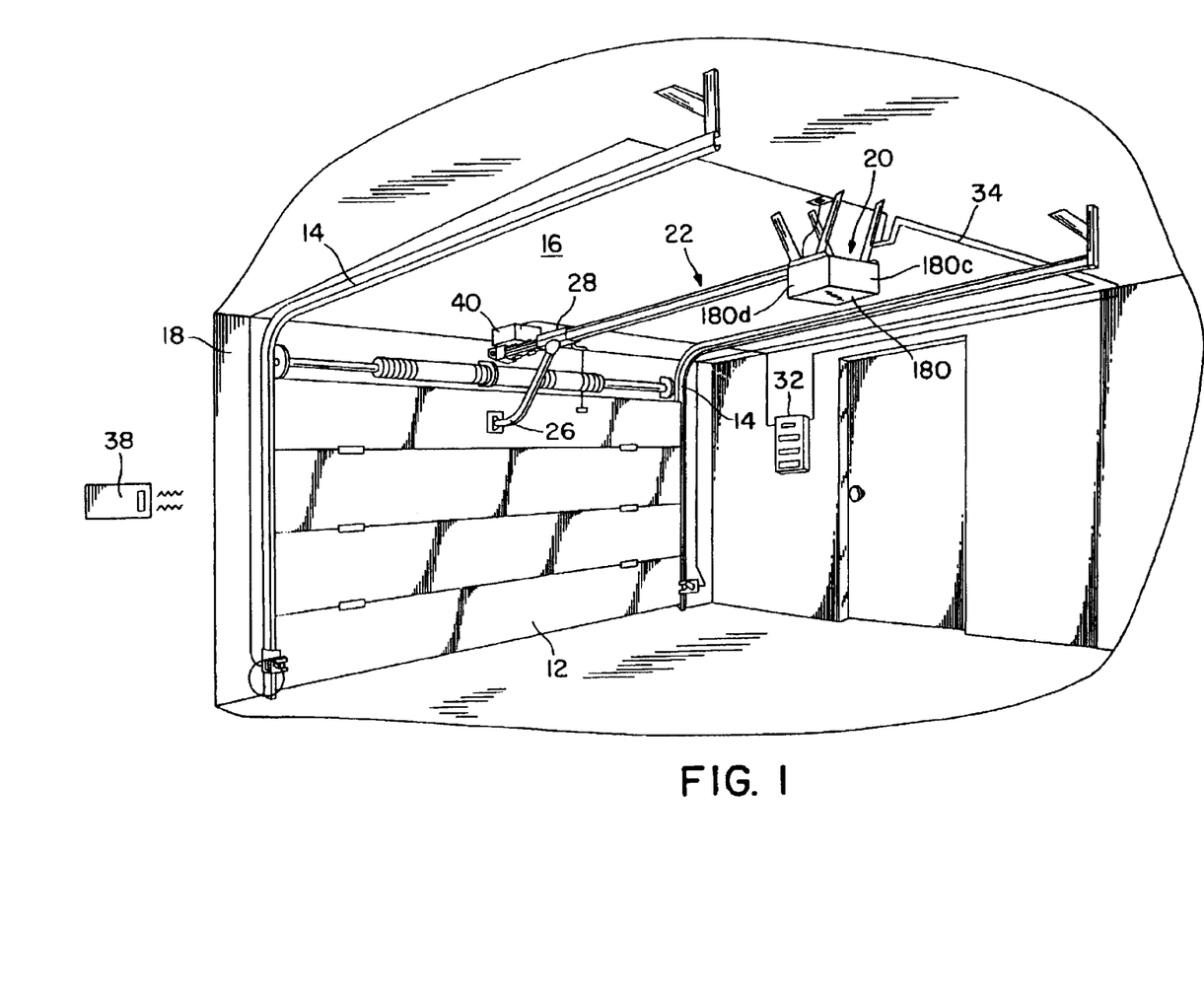
FIG. 1 is a perspective view of a garage door operating system in accordance with an embodiment of the invention.

Referring now to the drawings, and especially to FIG. 1, a movable barrier operator embodying the present invention is generally shown therein and identified by reference numeral 10. The movable barrier operator 10 is employed for controlling the opening and closing of a conventional overhead garage door 12 of a garage 13. The garage door 12 is mounted on guide rails 14 for movement between the closed position illustrated in FIG. 1 and an open or raised position. The garage 13 includes a ceiling 16 and a wall 18 defining an opening blocked by garage door 12. As shown, guide rails 14 are mounted to wall 18 and ceiling 16 of the garage 13 in a conventional manner.

A power drive unit car head, generally indicated at 20, is mounted to the ceiling 16 in a conventional manner. An integrated drive rail 22 extends between the power drive unit 20 and the garage wall 18. As can be seen in FIG. 1, one end of integrated drive rail 22 is mounted to a portion of the garage wall 18 located above the garage door 12. An operator arm 26 is connected at one end to the garage door 12 and at the other end to a trolley 94 mounted for movement back and forth, along the integrated drive rail 22. As will be seen herein, a motor in the power drive unit 20 propels the trolley 94 in a desired manner to raise and lower garage door 12 via the coupling of the trolley 94 and the operator arm 26 to the garage door 12.

A push button control unit 32, which includes an electronic controller and a keypad, is coupled by electrical conductors 34 to the power drive unit 20 and sends signals to the power drive unit, controlling operation of the drive motor therein. Preferably, the power drive unit 20 also includes a conventional radio receiver (not shown) for receiving radio signals from a remote control transmitter 38. An optional auxiliary power drive unit 40 is shown coupled to one end of integrated drive rail 22, being mounted on wall 18, atop door 12. If desired, operational flexibility of the integrated drive rail assembly may allow relocation of the main drive unit to a point adjacent the door.

Figure 2:
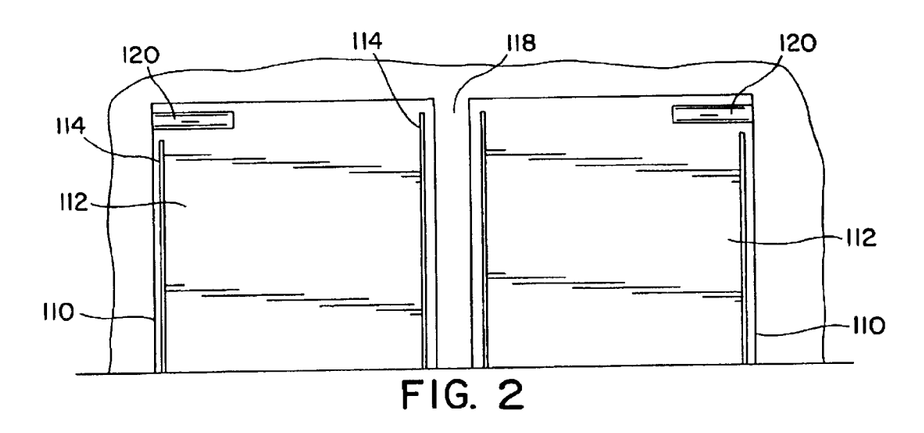
FIG. 2 is a perspective view of a rolling shutter operating system in accordance with an alternative embodiment of the invention.

Referring now to FIG. 2, a barrier operator system employing an absolute position detector is employed for controlling the opening and closing of a conventional rolling shutter 112. The rolling shutter is mounted on guide rails 114 for movement between the closed position illustrated in FIG. 2 and an open or raised position. The wall 118 defines an opening blocked or covered by rolling shutter 112. As shown, guide rails 114 are mounted to wall 118 in a conventional manner.

A power drive unit or head, generally indicated at 120, is mounted to the top of frame 110 in a conventional manner. Although the head unit is shown as being mounted on the exterior, as noted above, in many applications, the head unit is built into the wall so the user sees only the shutters. In the two views shown in FIG. 2, the head unit 120 is shown mounted on opposite sides of the top of frame 110. As will be seen herein, a motor in head unit 120 propels a sleeve or tube 142 to raise and lower rolling shutter 112 via the coupling of sleeve 142 to rolling shutter 112.

Control for head unit 120 may be as described above for garage door operator 20, i.e., using a push button control or a keypad mounted at another location on a wall. Additionally, head unit may also include a conventional radio receiver (not shown) for receiving radio signals from a remote control transmitter. If desired, the head unit 120 may be mounted on either side of the frame 110.

Figure 3:
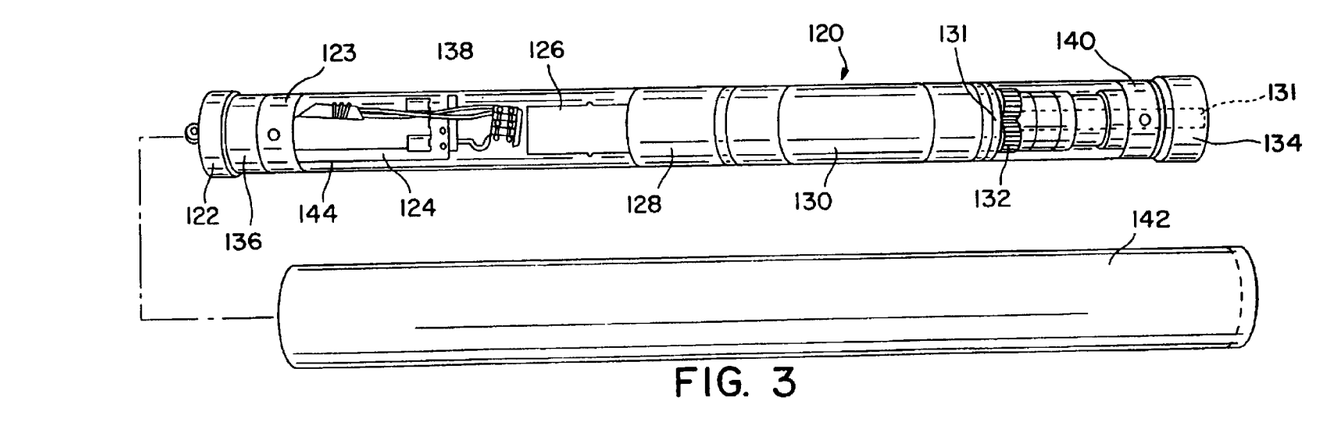
FIG. 3 is a perspective view of the tubular motor assembly of FIG. 2.
Figures 4, 5:
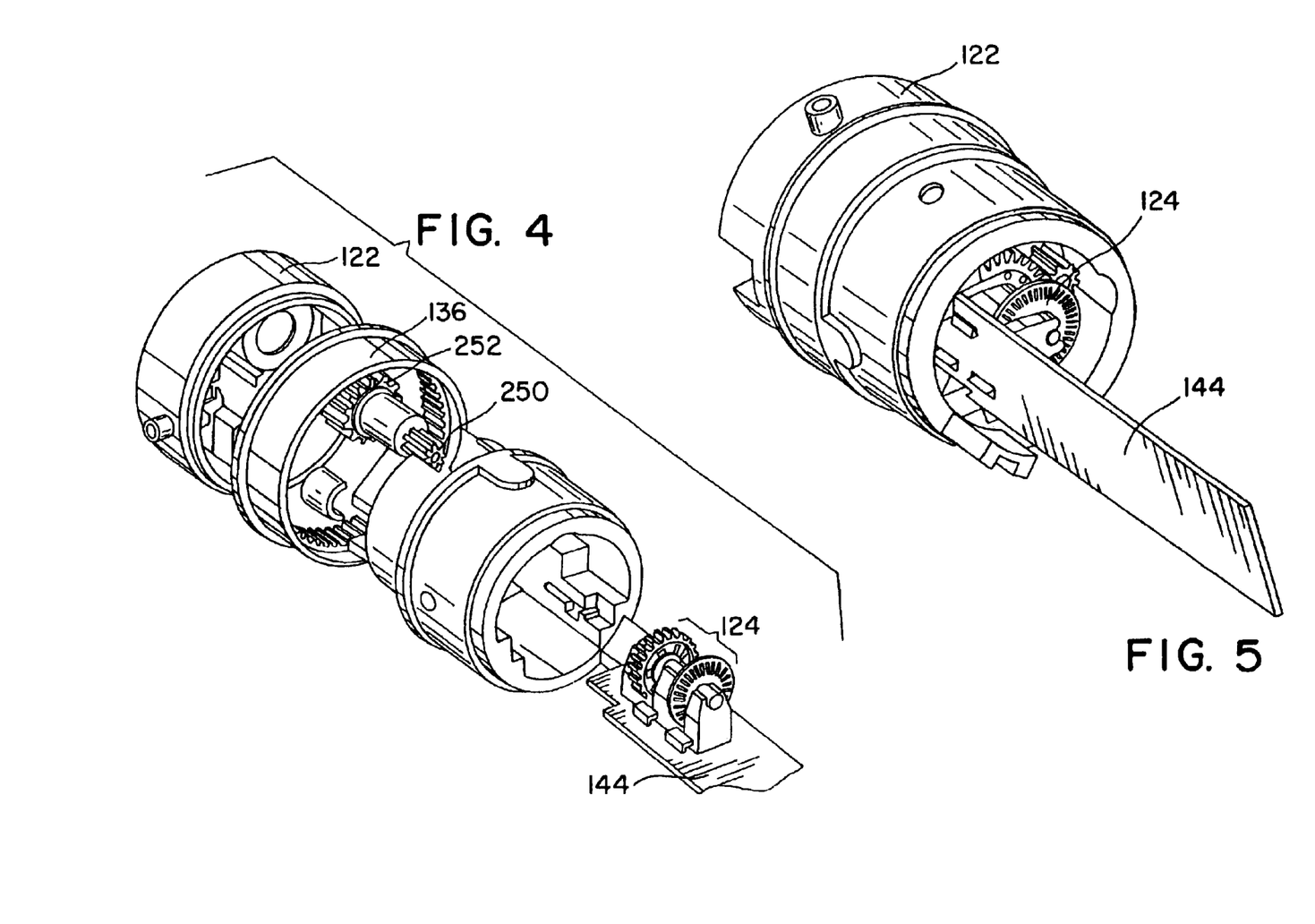
FIGS. 4 and 5 are two exploded perspective views of the location of the absolute position detector assembly shown in FIG. 3.

As shown in FIGS. 3, 4 and 5, head unit 120 includes a tubular housing 138 and end section 122 and 134. Within the housing 138 is the motor 130 which includes an output shaft 131 coupled at one end to end section 134 and at the other end to driving gear assembly 132. The output from gear assembly 132 is provided to output ring 140, which is fixedly attached to outer sleeve 142. Rolling shutters are attached to outer sleeve 142, so that when motor 130 runs, outer sleeve 142 rotates, causing rolling shutters to open or close (depending on the direction of rotation of motor 130).

Outer sleeve 142 is also fixedly attached to ring 136. Ring 136 drives absolute position detector assembly 124. Position detector assembly 124 is coupled to control board 144. Control board 144 contains the electronics for starting and controlling motor 130 (see FIG. 11). Capacitor 126 is used to start motor 130 (described below). A brake 128 is provided to slow motor 130 when the rolling shutters are approaching a limit position.

Figure 6:
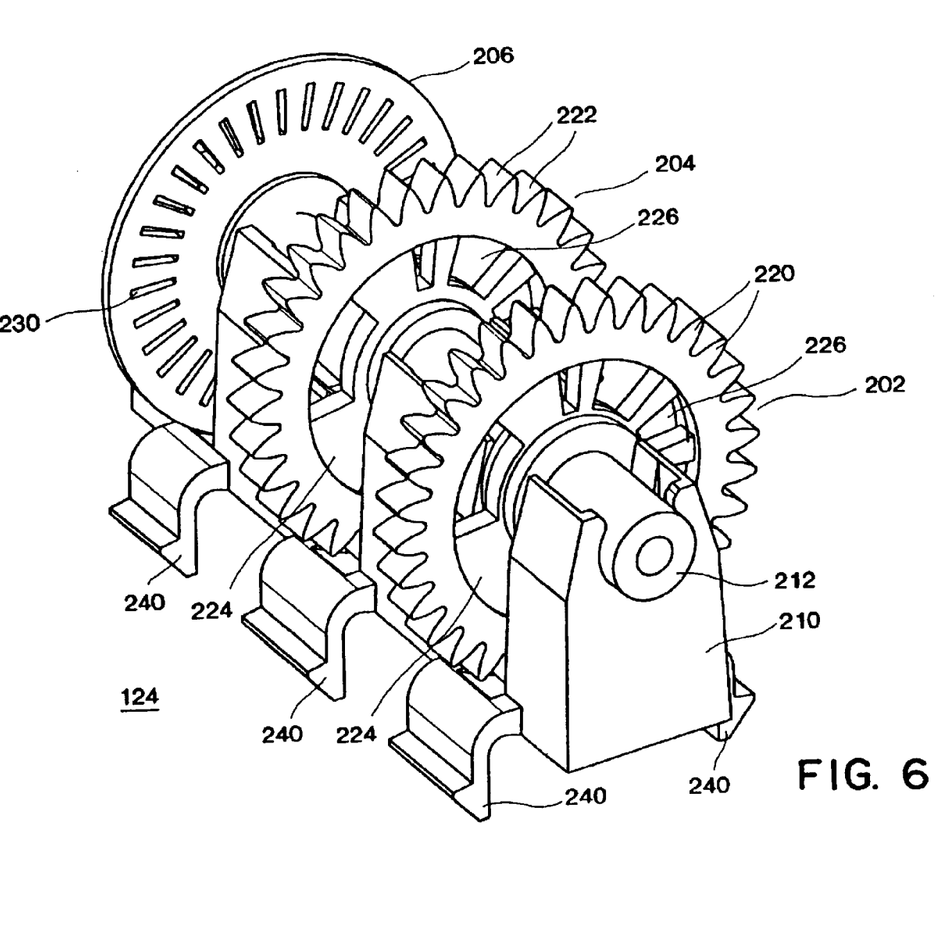
FIG. 6 is an enlarged perspective view of the absolute position detector assembly of FIG. 4.
Figure 7:
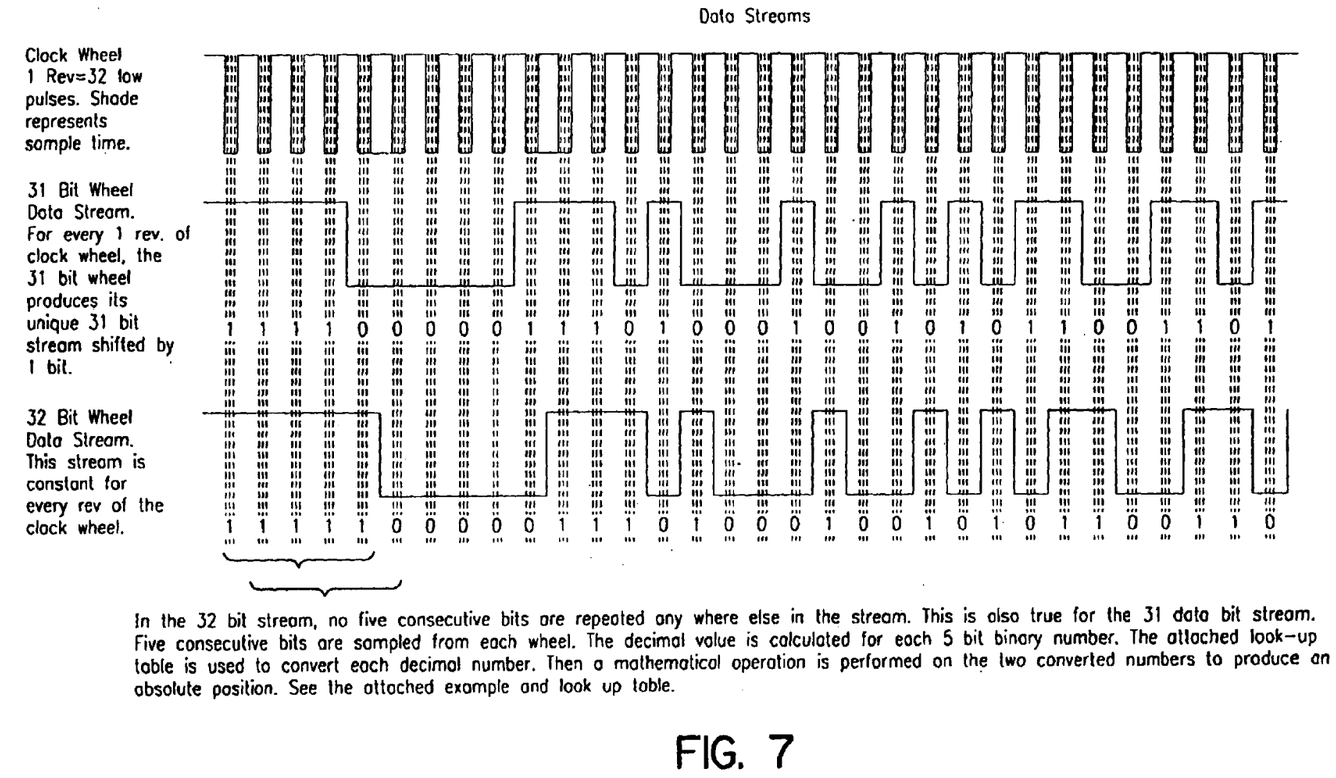
FIG. 7 is a graph of the 32 bit data streams produced in each of the 31 bit wheel and 32 bit wheel.

Referring to FIGS. 6 and 7, absolute position detector assembly 124 includes a clock wheel 206, which is attached to axle 212 for rotation therewith. Axle 212 rests in supports 210, and freely rotates therein, which are attached to board 140 by legs 240. Clock wheel 206 includes 32 equally spaced openings 230. The clock wheel 206 provides a digital low pulse signal when the center of a data bit on the 32 teeth wheel 202 lines up with the center of a data bit on the 31 teeth wheel 204 and when these centers are in line with the IR sensors—through an opening 230 (not shown). The clock signal is provided to the microprocessor which uses the clock signal as an interrupt to sample binary data from each data wheel. 32 bit wheel 202 is attached to axle 212 for rotation therewith. Each complete rotation of the 32 bit wheel 202 corresponds to one complete rotation of clock wheel 206. 32 bit wheel 202 includes 32 teeth or gears 220, which are driven by pinion 252 (see FIG. 4) which is driven by ring 136. 31 bit wheel 204 includes 31 teeth or gears 222 which are also driven by pinion 252. 31 bit wheel 204 freely spins about axle 202. One turn of the 32 bit wheel 202 corresponds to 32/31 turns of the 31 bit wheel 204.

A unique bit stream pattern is formed in each of 32 bit wheel 202 and 31 bit wheel 204. Beneath the teeth 220 are solid areas 226 and spaces 224. A space under a tooth 220 corresponds to a 0; a solid area 226 correspond to a 1. The exact pattern is shown in FIG. 7. The first row of pulses are the 32 pulses generated by the clock wheel 206. One complete revolution of the clock wheel generates 32 low pulses, representing sample time. The 31 bit wheel has solid and spaces areas which correspond to a 31 bit data stream: 1111000001110100010010101100110 as shown in the second row of FIG. 7. For every one complete revolution of the clock wheel, the 31 bit wheel produces the unique 31 data stream plus one rollover bit. The 32 bit wheel 202 generates the data stream: 11111000001110100010010101100110, which is the same pattern as the 31 bit data stream with the addition of an extra 1 at the beginning of the stream. This data stream is constant for every revolution of the clock wheel.

In the 32 bit stream, no five consecutive bits are repeated anywhere else in the stream. This is true for the 31 bit data stream. When the unit is powered for movement, five consecutive (or sequential) bits are sampled from each wheel. The decimal value is calculated for each 5 bit number. The lookup table A (attached hereto) is used to convert the 5 bit number to a decimal number. Then a mathematical operation is performed on the two converted numbers (from the 31 bit wheel and the 32 bit wheel) to produce an absolute position.

Referring to FIG. 7, if the unit were powered up with the wheels aligned as shown in FIG. 7, the first 5 bit data stream sampled would be: 11110 for the 31 bit wheel and 11111 for the 32 bit wheel. In the next clock cycle, after rotation of 1/32 of the clock wheel a clock pulse is generated, the 31 bit wheel produces 11100 and the 32 bit wheel produces 11110. Continuing for 32 1/32 steps, or 32 5 bit frames, each sequential or consecutive 5 bit data stream produced by each wheel is unique.

Figure 8:
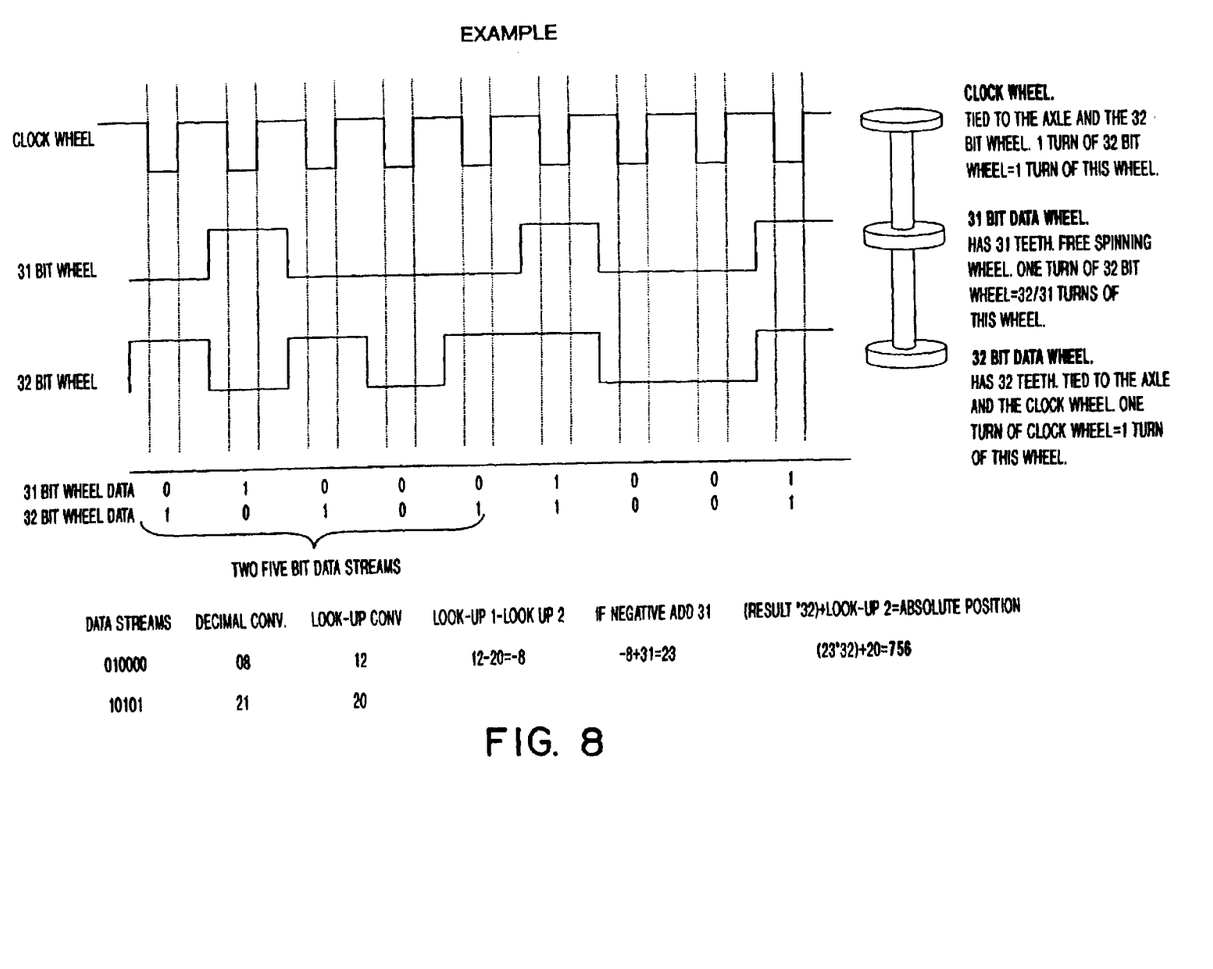
FIG. 8 is an example calculation of position using the 31 bit wheel and the 32 bit wheel.

An example calculation is shown in FIG. 8. A 5 data stream is sampled from each of the 31 bit wheel and the 32 bit wheel. In this example, the 31 bit wheel produces the 5 bit data stream: 01000. The 32 bit wheel produces the 5 bit data stream 10101. These numbers convert to 08 (Lookup1) 21 (Lookup2), respectively, using the lookup table A. 12−20=−8. If the result is negative, add 31 (Same as modulo 31 arithmetic). Apply the mathematical formula: (Result× 32)+Lookup2=Absolute position. This gives an absolute position of 756 out of 992 possible positions along the path of travel.

Figure 9:
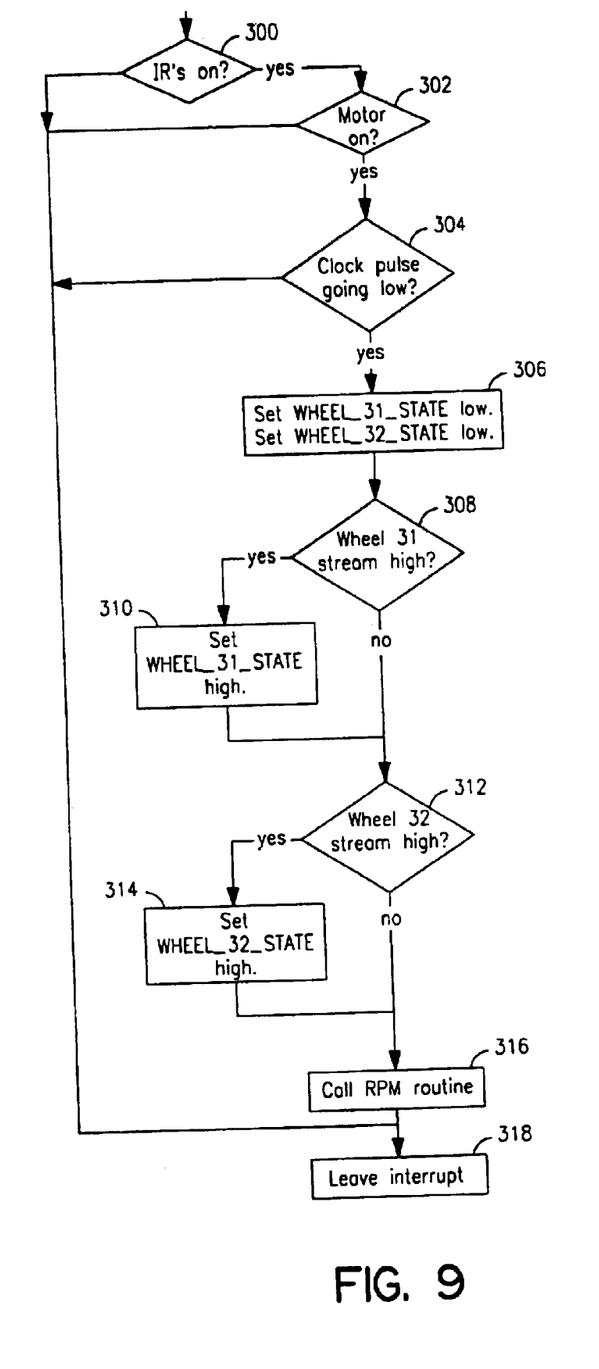
FIG. 9 is a flow chart of the routine run by the controller to sample the 5 bit data streams.

The calculation of absolute position is performed in two interrupt routines by the controller. The first interrupt routine samples the clock and data wheels and generates the next bit to be used in the sliding window or sliding 5 bit data stream. When the clock wheel generates a digital low pulse, the controller executes the absolute position routine, shown in FIG. 9. Referring to FIG. 9, at step 300, the routine checks if the IR sensor and detector are operational. If the IR sensor and detector are not operational, the controller leaves the routine at step 318. If the IR sensor and detector are operational, the routine checks if the motor is on at step 302. If not, the routine exits at step 318. If the motor is on, the routine checks at step 304 if the clock pulse is going low, indicating the beginning of a clock pulse. If not, the routine exits at step 318.

If the clock pulse is acing low, the routine sets the state of the 31 bit wheel (WHEEL_31_STATE) register and the state of the 32 bit wheel state (WHEEL_32_STATE) register low in step 306. These registers store the value of the next detected data bit. At step 308, the routine checks if the 31 bit wheel stream is high. If yes, it sets the 31 state register to high in step 310. If not, it continues to block 312 where it checks if the 32 bit wheel stream is high. If yes, it sets the 32 bit wheel state register to high at step 314. If not, it calls the RPM routine, then leaves the routine at step 318. The RPM routine takes the current bit and uses it to create the next 5 bit data stream for use in calculating the absolute position of the shutter.

Once the 5 bit streams are computed and stored, the controller computes the absolute position as described above and uses that information to keep track of where the door or shutter is at each clock cycle and as a validity check for director of movement. It should be noted that if the awning, door or shutter is moved manually, movement of the door or shutter will drive the pinions moving the clock wheel and 31 bit wheel and 32 bit wheel, so door/shutter position is always mechanically recorded in the absolute position detector assembly, ready for reading when the unit is powered on.

Figure 10:
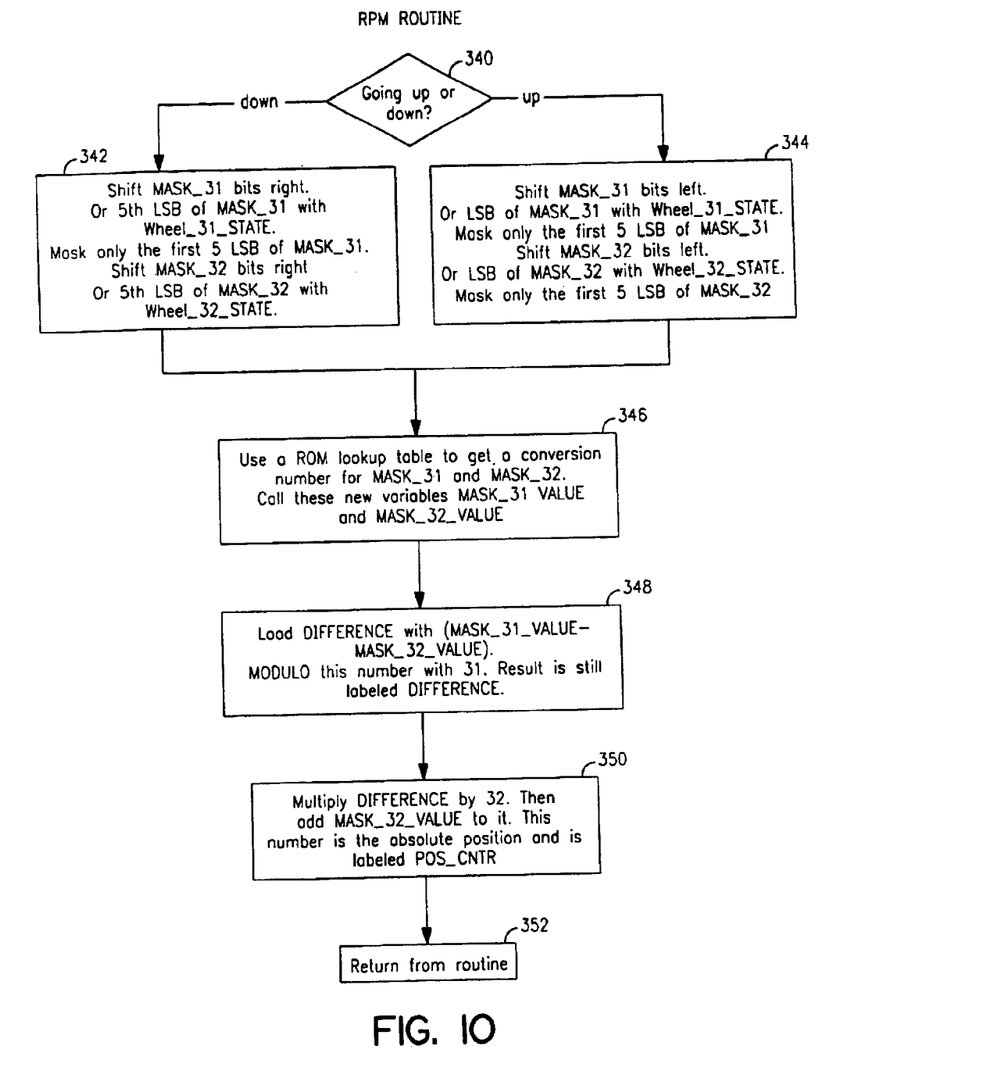
FIG. 10 is a flow chart of the RPM routine used by the controller to sample the 5 bit data streams.

After the current bit from each wheel is stored in the appropriate register, the RPM routine is called. Referring to FIG. 10, at step 340, the routine checks for the direction of travel. This information is typically provided by the user input when the user selects the up button or down button. As noted above, this information can be verified changed if the absolute position information does not check out between successive clock pulses.

If the shutter is moving up the routine branches to step 344. If the shutter is moving down, the routine branches to step 342. Each step 342 and 344 forms the appropriate sliding window (determines the consecutive 5 bits to be used in calculating the shutter position). In step 344 the routine shifts the MASK_31 bits left. The MASK_31 mask is a window of all 31 bits the 31 bit wheel. Then the least significant bit of the MASK_31 is logically OR'd with the 31 bit wheel state register. Only the first 5 bits of the MASK_31 mask (which contains the entire 31 bit data stream represented on the 31 bit wheel) are masked. Then the MASK_32 bit mask (which contains the entire 32 bit data stream represented on the 32 bit wheel) is shifted left one bit and the least significant bit of the MASK_32 bit mask is logically OR'd with the value in the 32 bit wheel state register. Only the first 5 bits are masked. This gives two shifted 5 bit data streams, one each from the 31 bit wheel and the 32 bit wheel, which are used to determine the position of the shutter for that clock cycle.

In step 342 the routine shifts the MASK_31 bits right. Then the 5th least significant bit of the MASK_31 is logically OR'd with the WHEEL_31_STATE register. Then only the first five least significant bits of the MASK_31 are masked. The MASK_32 mask is shifted one bit right. Then the MASK_32 mask is logically OR'd with the WHEEL_32STATE register.

In step 346 the routine uses a ROM lookup table (see Table A) to get a conversion for the numbers in MASK_31 and MASK_32. These digital numbers are stored in the variables MASK_31_VALUE and MASK_32_VALUE. In step 348, the difference between MASK_31_VALUE and MASK_32_VALUE is calculated and the remainder from modulo 31 arithmetic calculated. This result is called the DIFFERENCE. In step 350 the DIFFERENCE is multiplied by 32. Then MASK_32_VALUE is added to the product. This number is the absolute position and is stored in the POS_CNTR. At step 354 the routine ends.

The controller uses the POS_CNTR value in controlling the operation of the shutter in its other routines, which are not described.

Figure 11A:
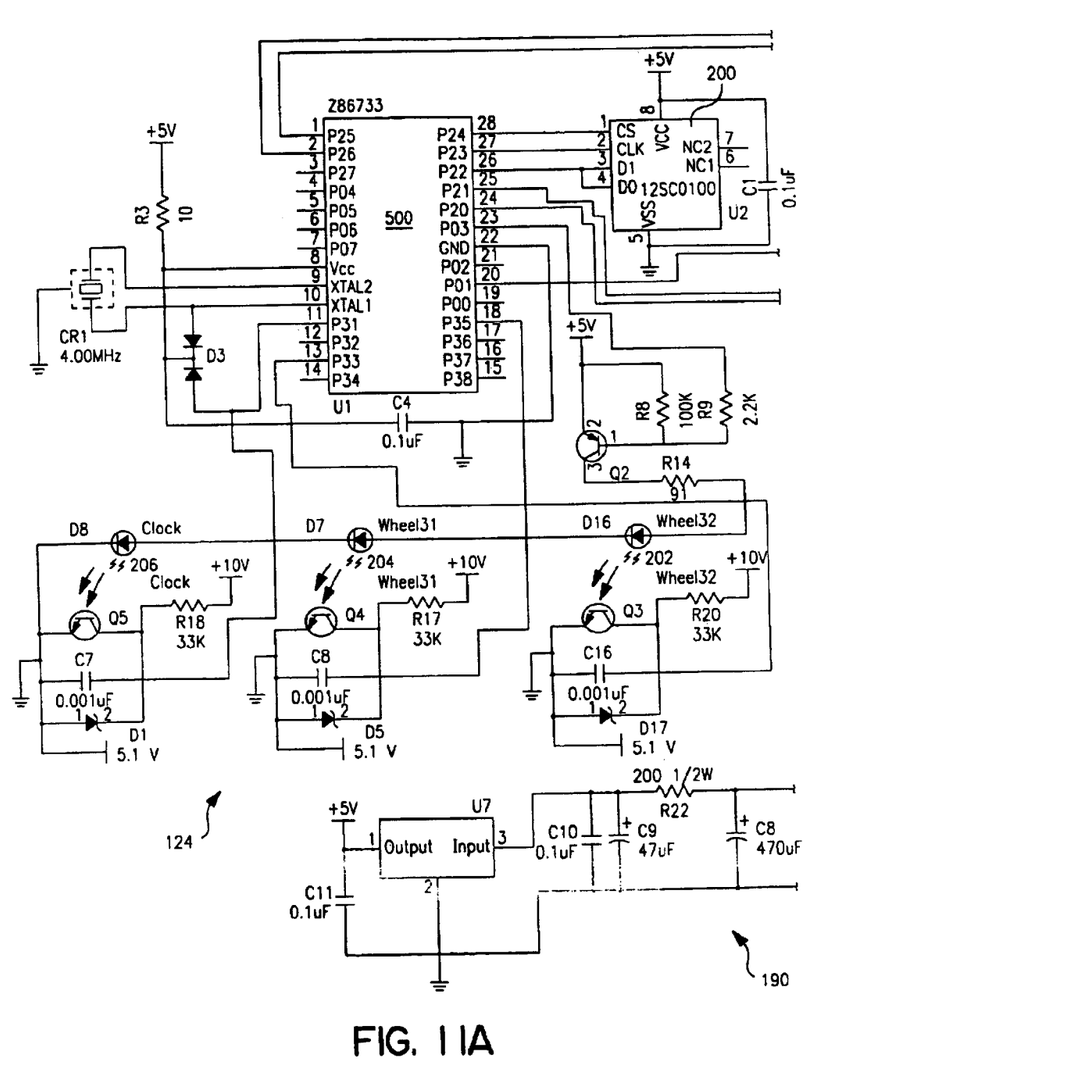
FIG. 11 is a schematic diagram of the electronics controlling the rolling shutter head unit of FIG. 2.
Figure 11B:
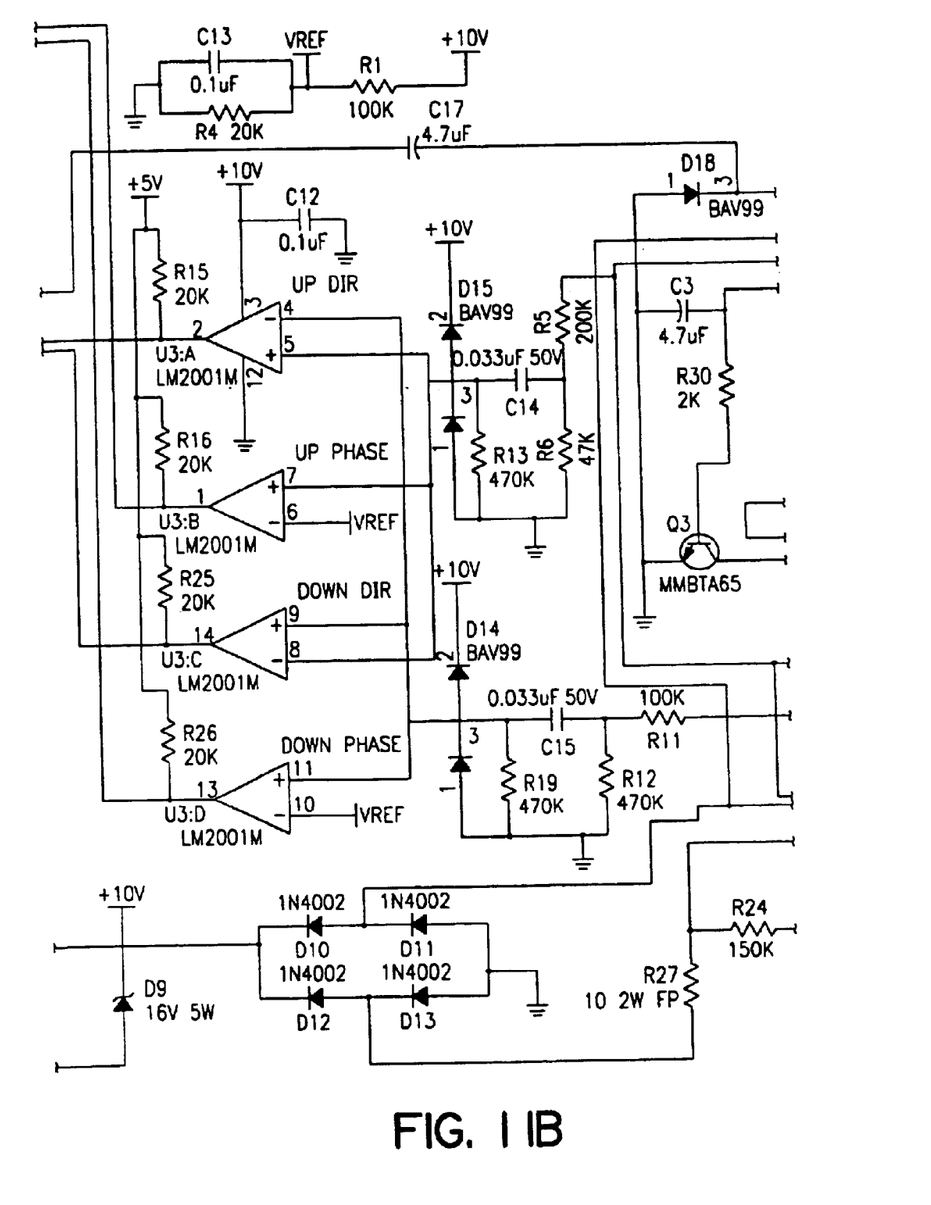
Figure 11C:
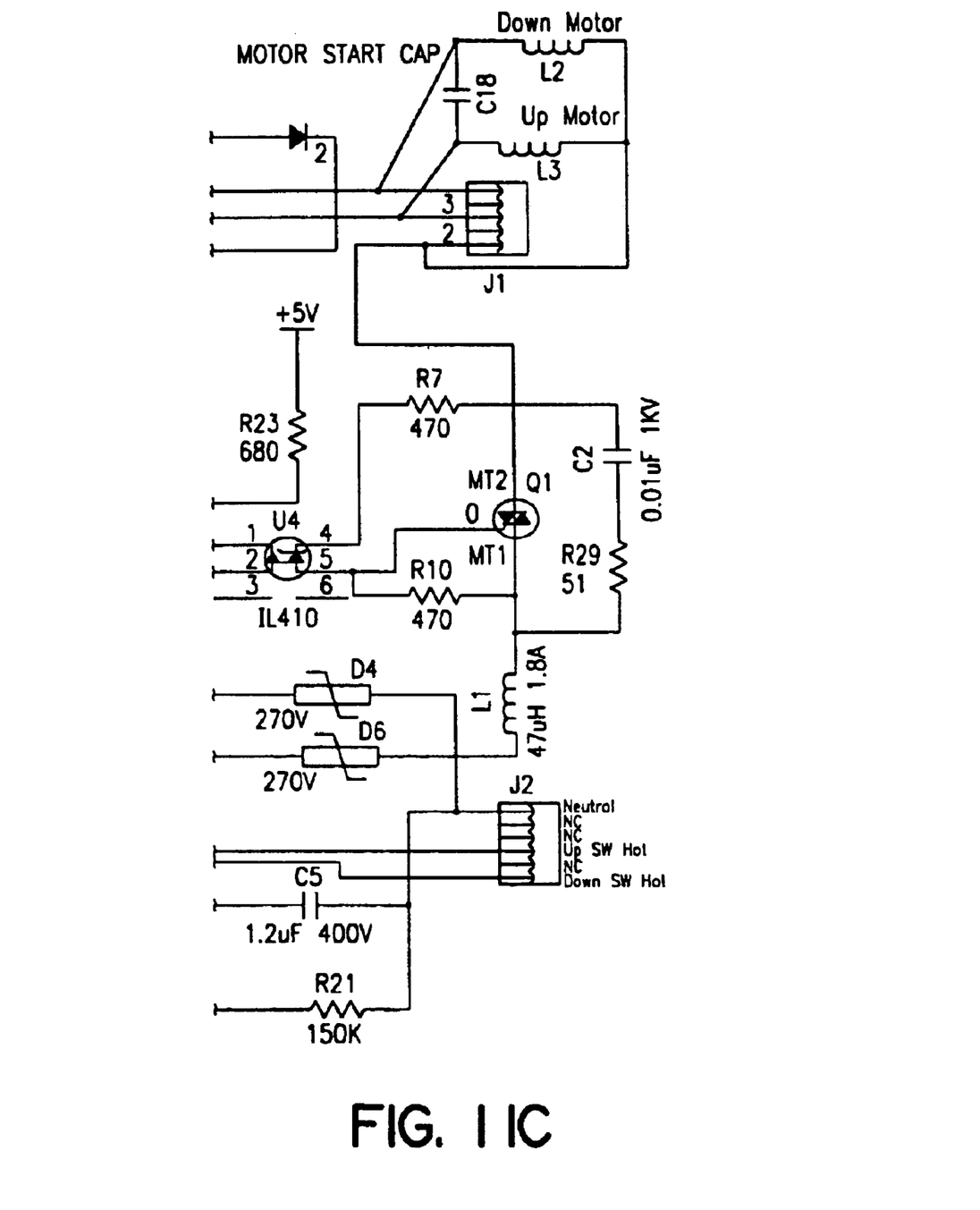

A schematic of the control circuit located on control board 142 is shown in FIG. 11. Controller 500 operates the various software routines which operate the rolling shutter operator 120. Controller 500 may be a Z86733 microprocessor. In this particular embodiment, the rolling shutter is controlled only by a wall-mounted or unit-mounted switch coupled via connector J2. Connector J2 has inputs for up switched hot and down switched hot. In a rolling shutter, the motor moves only when the user presses the power direction switch connected to connector J2 and the Triac Q1 is activated by the microcontroller. Pressing the up or down switch applies power to the board via connector J2 and provides various motor phase and direction information to the controller 500. When the controller 500 permits travel, Triac Q1 enables the motor's neutral path. The motor winding, which is then powered, will conduct current.

However, the control circuit can be modified to include a receiver so that the rolling shutter can be commanded from a remote transmitter (as described above). Power supply circuit 190 converts AC line power from connector J2 into plus 5 volts to drive the logic circuits and plus 16 volts for a voltage supply to the phototransistors Q4, Q5, Q6.

Upon receipt of a rolling shutter movement command signal through J2, the motor is activated. Feedback information from the motor and AC power is provided from J1 and applied to U3:A, U3:B, U3:C and U3:D. The outputs from U3:B and U3:D provide up and down phase information to pins P26 and P25 respectively. The outputs from U3:A and U3:C provide up and down direction to pins P21 and P20, respectively.

Crystal CR1 provides an internal clock signal for the microprocessor 500. EEPROM 200 stores the information such as limit flags, force flags, learn mode flags, etc. The IR signal break from clock wheel 206 drives Q5 which provides an input to signal P31. Wheel 31 drives Q4 which provides an input signal to P30. Wheel 32 drives Q3 which provides an input signal to P33.

Table A attached hereto is the lookup table described above.

Exhibit A (pages A1–A21) attached hereto include a source listing of a series of routines used to operate a movable barrier operator in accordance with the present invention.

As will be appreciated from studying the description and appended drawings, the present invention may be directed to operator systems for movable barriers of many types, such as fences, gates, shutters, awnings, garage doors, overhead doors and the like.

While there have been illustrated and described particular embodiments of the invention, it will be appreciated that numerous changes and modifications will occur to those skilled in the art, and it is intended in the appended claims to cover all those changes and modifications which fall within the true spirit and scope of the invention.

What is claimed is:

1. A position detector for determining the position of a movable object, the position detector comprising:
    two or more rotary members wherein each rotary member is encoded to form a unique bitstream pattern comprised of a predetermined number of bits and for generating a subcode based on the bitstream pattern, the subcode or combined subcodes having a bit value indicative of a position from a plurality of positions; and
    a controller for determining the action based on the indicated position.

2. The position detector according to claim 1, wherein each of the rotary members is configured such that the formed bitstream pattern is comprised of a predetermined unique number of bits thereby enabling each bitstream pattern to be unique relative to each of the other bitstream patterns.

3. The position detector according to claim 1, wherein inclusion of each additional rotary member increases the number of the plurality positions, wherein the increase in number of positions is based on the number of bits in the bitstream subcode pattern formed by each additional rotary member.

4. The position detector according to claim 1, further comprising a clock member for generating a timing signal, wherein the controller, responsive to the timing signal, samples each of the subcodes.

5. The position detector according to claim 1, wherein each of the subcodes is comprised of a differing number of bits.

6. The position detector according to claim 4, wherein the clock member comprises a light emitter, a light receiver and a rotary interrupter mechanism disposed therebetween for selectively interrupting transmission of light from the light emitter to the light receiver, wherein the timing signal is generated upon a transition of the light transmission.

7. The position detector according to claim 1, wherein the controller accesses a lookup table to convert the coded position to the physical position.

8. A method for determining the position of a movable object, the method comprising the steps of:

encoding two or more rotary members for enabling each rotary member to generate a unique bit pattern;

rotating each rotary member at least one revolution, thereby generating the unique bit pattern;

sampling a subset of each of the unique bit patterns for generating a unique subcode of each bit pattern; and determining a position of the movable object based on the generated subcode or combined subcodes.

9. The method of claim 8, wherein each generated subcode differs in bit length.

10. The method of claim 8, wherein each bit pattern differs in bit length.

11. The method of claim 8, wherein the determining step further comprises the step of referencing a table for converting the generated subcode to the determined position.

12. The method of claim 8, further comprising the steps of generating a clock signal for producing an interrupt; and sampling the bit pattern of each rotary member on each produced interrupt.

13. A position detector for determining the position of a movable object, the position detector comprising:

one or more rotary members wherein each rotary member is encoded to form a unique bitstream pattern comprised of a predetermined number of bits and for generating a subcode based on the bitstream pattern, the subcode or combined subcodes having a bit value indicative of a position from a plurality of positions;

a controller for determining the action based on the indicated position; and wherein inclusion of each additional rotary member increases the number of the plurality positions, wherein the increase in number of positions is based on the number of bits in the bitstream subcode pattern formed by each additional rotary member.

14. A position detector for determining the position of a movable object, the position detector comprising:

one or more rotary members wherein each rotary member is encoded to form a unique bitstream pattern comprised of a predetermined number of bits and for generating a subcode based on the bitstream pattern, the subcode or combined subcodes having a bit value indicative of a position from a plurality of positions;

a controller for determining the action based on the indicated position, and further comprising a clock member for generating a timing signal, wherein the controller, responsive to the timing signal, samples each of the subcodes.

* * * * *